United States Patent [19]

Mohri et al.

[11] Patent Number: 5,419,988

[45] Date of Patent: May 30, 1995

[54] PHOTOMASK BLANK AND PHASE SHIFT PHOTOMASK

[75] Inventors: Hiroshi Mohri; Keiji Hashimoto; Masahiro Takahashi; Wataru Goto; Yukio Iimura, all of Tokyo, Japan

[73] Assignee: Dai Nippon Printing Co., Ltd., Tokyo, Japan

[21] Appl. No.: 102,488

[22] Filed: Aug. 5, 1993

[30] Foreign Application Priority Data

| Aug. 7, 1992 [JP] | Japan | 4-211230 |
| Aug. 7, 1992 [JP] | Japan | 4-211231 |
| Aug. 21, 1992 [JP] | Japan | 4-222405 |

[51] Int. Cl.⁶ ............................................. G03F 9/00
[52] U.S. Cl. .......................................... 430/5; 430/14; 428/209; 428/469; 428/472
[58] Field of Search ............ 430/5, 14; 428/209, 428/469, 472; 156/652, 656

[56] References Cited

U.S. PATENT DOCUMENTS

| 4,363,846 | 12/1982 | Kaneki | 428/203 |
| 4,374,912 | 12/1983 | Kaneki et al. | 430/5 |
| 4,440,841 | 4/1984 | Tabuchi | 430/5 |
| 4,556,608 | 12/1985 | Kaneki et al. | 428/629 |

*Primary Examiner*—S. Rosasco
*Attorney, Agent, or Firm*—Dellett and Walters

[57] ABSTRACT

A phase shift photomask and a photomask blank used to produce the same. A dry etching stopper layer, which is disposed between a substrate and a light-shielding layer or between the substrate and a phase shifter layer, is made of either a film mainly composed of tin oxide nitride, which has high etching selectivity and high permeability, or an alumina film formed by sputtering, followed by heat treatment carried out in an oxidizing atmosphere, thereby enabling the required overetching to be satisfactorily performed during etching of the phase shifter layer, and thus making it possible to effect precise phase control. In addition, it is possible to eliminate the occurrence of an in-plane transmittance distribution.

10 Claims, 10 Drawing Sheets ial circuits (LSI), very large-scale integrated circuits (VLSI), etc., and to photomask blanks used to produce such photomasks. More particularly, the present invention relates to a phase shift photomask and a photomask blank therefor.

PHOTOMASK BLANK AND PHASE SHIFT PHOTOMASK

BACKGROUND OF THE INVENTION

The present invention relates to photomasks employed for producing integrated circuits of high integration density, e.g., large-scale integrated circuits (LSI), very large-scale integrated circuits (VLSI), etc., and to photomask blanks used to produce such photomasks. More particularly, the present invention relates to a phase shift photomask and a photomask blank therefor.

Semiconductor integrated circuits, e.g., IC, LSI, VLSI, etc., are produced by repeating a lithography process in which a resist is coated on a substrate to be processed, e.g., a silicon wafer, and this resist is subjected to exposure by a stepper or other exposure system to form a desired pattern thereon, followed by development, etching, doping, CVD, and so forth.

With the achievement of high performance and high integration density of semiconductor integrated circuits, photomasks used in such a lithography process have increasingly been demanded to have a high degree of accuracy. For example, in the case of DRAMs, which are of a typical type of LSI, a 5×reticle for 1M-bit DRAMs, that is, a photomask having a pattern of size which is 5 times the size of a pattern to be formed on a wafer by exposure, is demanded to have a dimensional accuracy of 0.15 μm even for a mean value of ±3σ (σ: standard deviation). Similarly, 5×reticles for 4M-bit DRAMs, 16M-bit DRAMs and 64M-bit DRAMs are demanded to have dimensional accuracies of from 0.1 μm to 0.15 μm, from 0.05 μm to 0.1 μm, and from 0.03 μm to 0.07 μm, respectively.

In addition, there is an increasing demand for reduction in the line widths of device patterns formed by using these reticles: 1.2 μm for 1M-bit DRAMs; 0.8 μm for 4M-bit DRAMs; 0.6 μm for 16M-bit DRAMs; and 0.35 μm for 64M-bit DRAMs. To comply with these demands, various exposure methods have heretofore been studied.

However, device patterns for future advanced devices, e.g., 64M-bit DRAMs, cannot be realized by the conventional stepper exposure method that employs a photomask because of the resist pattern resolution limit of this method. To overpass this limit, a reticle based on the new idea of phase shift photomask has been proposed, as disclosed, for example, in Japanese Patent Application Laid-Open (KOKAI) No. 58-173744 and Japanese Patent Application Post-Exam Publication No. 62-59296. Phase lithography that employs a phase shift photomask is a technique whereby the resolution and contrast of the projected image are improved by controlling the phase of light passing through a reticle.

In the phase shift lithography, high-precision control of the phase shift angle is demanded in order to improve the resolution and contract of the projected image during the pattern transfer. The phase shift angle is determined by the film thickness and refractive index of the phase shifter pattern. In particular, the control of the film thickness is a serious problem in production of a phase shift photomask. Etching of the phase shifter layer is performed by the dry etching method, which is excellent in fine processing of high accuracy. However, the method whereby the film thickness of the phase shifter pattern can be controlled most reliably is to select materials for the phase shifter layer and the underlying layer so that the ratio (selectivity) of the dry etch rate of the phase shifter layer to that of the underlying layer is satisfactorily high, and to carry out dry etching for a time longer by a specific time than a length of time considered necessary for the phase shifter layer to be completely removed, that is, to perform overetching. With this method, a uniform etch depth is obtained with high accuracy over the entire surface of the substrate. Overetching may also be necessary for arranging the pattern cross-section in the desired configuration.

However, when quartz and commercially available coating glass (Accuglass 211S, manufactured by Allied Signal) are employed as a glass substrate and a phase shifter material, respectively, the dry etch selectivity is undesirably low, i.e., only about 1.5 to 2.0 at the highest, so that even if minimum required overetching is performed, the glass substrate is etched to such an extent that the phase shift angle is affected.

For this reason, it is indispensably necessary in order to control the phase shift angle with high accuracy to provide on the glass substrate a so-called etching stopper layer made of a material having a sufficiently high etch selectivity relative to the phase shifter layer. As a substance which can function as such an etching stopper layer, a transparent electrically conductive film is known which is mainly composed of tin oxide, as shown, for example, in Japanese Patent Application Post-Exam Publication No. 61-61664.

However, the transparent electrically conductive film, which is mainly composed of tin oxide, absorbs i-rays from a mercury-arc lamp used as illuminating light for pattern transfer. Therefore, an intensity of illuminating light adequate for practical use cannot be obtained at regions where the light-shielding layer is selectively removed unless the film thickness is held down to a level of about 15 nm.

However, the dry etching resistance of the above-described transparent electrically conductive film is not sufficiently high. Therefore, the film of about 15 nm in thickness is completely removed by overetching performed for about 20 minutes, resulting in a failure to function as an etching stopper layer.

Accordingly, a phase shift photomask produced from such a photomask blank makes it impossible to perform sufficient overetching for the phase shifter layer. Therefore, it becomes difficult to effect precise phase control.

In addition, since the film which absorbs light as described above decreases in thickness during the overetching process, as described above, an in-plane transmittance distribution undesirably occurs between regions where the phase shifter film has been selectively removed by the overetching and regions where phase shifter layer remains unremoved.

SUMMARY OF THE INVENTION

Under the above-described circumstances, it is an object of the present invention to provide a phase shift photomask and a photomask blank, which have an etching stopper layer that only slightly absorbs i-rays from a mercury-arc lamp and therefore can be formed to a necessary film thickness and that is sufficiently resistant to overetching so that the phase shift angle can be controlled with high accuracy during the production of the phase shift photomask.

In view of the above-described problems, the present inventors conducted exhaustive studies in order to develop a phase shift photomask which enables an improvement in the phase shift angle controllability of the phase shifter layer and also a photomask blank for production of the phase shift photomask, and as a result, we accomplished the present invention.

That is, the present invention provides a photomask blank and a phase shift photomask, which have a dry etching stopper layer composed mainly of tin oxide nitride, which is formed on an optically polished glass substrate by thin-film technology, for example, sputtering, vacuum evaporation, ion plating, etc.

To form a tin oxide nitride layer by sputtering, a target composed mainly of metallic tin or a tin oxide is used, and a substrate is exposed to a plasma produced by applying DC or RF electric power to an atmosphere maintained under an appropriate pressure, which is a combination of a sputter gas, e.g., argon, neon, xenon, nitrogen, etc., an oxygen source gas, e.g., oxygen, carbon dioxide gas, nitrogen oxide gas, water vapor, air, etc., and a nitrogen source gas, e.g., nitrogen, nitrogen oxide gas, etc.

To form a tin oxide nitride layer by vacuum evaporation, ordinary electron beam evaporation in which an evaporation source is heated by an electron gun may be used. With this method, a sintered material or powder which is composed mainly of metallic tin or a tin oxide is used as an evaporation source, and a mixture of an oxygen source gas, e.g., oxygen, carbon dioxide gas, nitrogen oxide gas, water vapor, air, etc., and a nitrogen source gas, e.g., nitrogen, a nitrogen oxide gas, etc., is used as an atmosphere for the film forming process.

To form a tin oxide nitride layer by ion plating, ordinary ion plating may be used. With this method, a sintered material or powder which is composed mainly of metallic tin or a tin oxide is used as an evaporation source, and a mixture of an oxygen source gas, e.g., oxygen, carbon dioxide gas, nitrogen oxide gas, water vapor, air, etc., and a nitrogen source gas, e.g., nitrogen, nitrogen oxide gas, etc., is used as an atmosphere for the film forming process.

According to the present invention, a dry etching stopper layer comprises a film composed mainly of tin oxide nitride which is formed in an atmosphere made up of an oxygen source gas and a nitrogen source gas, as described above. The tin oxide nitride film is superior to the conventional film composed mainly of tin oxide in terms of permeability to i-rays from a mercury-arc lamp and dry etching resistance. The tin oxide nitride film can be produced by using a conventional system for producing a photomask blank and a photomask electrically conductive film. Therefore, no extensive modification is needed for the conventional manufacturing equipment.

Unlike the conventional film composed mainly of tin oxide, the film composed mainly of tin oxide nitride, which is formed by the above-described method, is not electrically conductive. Electrical conductivity is not always necessary for an etching stopper layer used for a photomask blank and a phase shift photomask, which are the object of the present invention. However, electrical conductivity can be attained to the level of that of the conventional film composed mainly of tin oxide by heating the substrate to an appropriate temperature during the formation of the tin oxide nitride film, or by firing the film at an appropriate temperature after the formation of it.

It is a matter of course that a light-shielding layer used for the photomask blank and phase shift photomask of the present invention may be a single- or multilayer film composed mainly of chromium, chromium oxide, molybdenum silicide, molybdenum silicide oxide, etc., which is employed for the conventional photomasks.

The phase shift photomask and photomask blank therefor, which have an etching stopper layer composed mainly of tin oxide nitride, formed as described above, are improved in the phase shift angle controllability of the phase shifter layer because the etching stopper layer is highly resistant to dry etching.

In the present invention, the etching stopper layer composed mainly of tin oxide nitride may be replaced by an alumina film formed by sputtering, followed by heat treatment carried out in an oxidizing atmosphere, as will be explained in the description of the embodiments.

As will be clear from the foregoing description, the first photomask blank of the present invention is a photomask blank formed by successively stacking a dry etching stopper layer and a light-shielding layer in the mentioned order on an optically polished substrate, wherein the dry etching stopper layer comprises either a film composed mainly of tin oxide nitride or an alumina film formed by sputtering, followed by heat treatment carried out in an oxidizing atmosphere.

The second photomask blank of the present invention is a phase shift photomask blank formed by successively stacking a dry etching stopper layer, a light-shielding layer, and a phase shifter layer in the mentioned order on an optically polished substrate, wherein the dry etching stopper layer comprises either a film composed mainly of tin oxide nitride or an alumina film formed by sputtering, followed by heat treatment carried out in an oxidizing atmosphere.

The third photomask blank of the present invention is a phase shift photomask blank formed by successively stacking a dry etching stopper layer, a phase shifter layer, and a light-shielding layer in the mentioned order on an optically polished substrate, wherein the dry etching stopper layer comprises either a film composed mainly of tin oxide nitride or an alumina film formed by sputtering, followed by heat treatment carried out in an oxidizing atmosphere.

Either of the second and third photomask blanks may be formed as a blank for a halftone phase shift photomask by arranging it so that when the transmittance of the substrate with respect to the wavelength of exposure light applied during transfer is assumed to be 100%, the overall exposure light transmittance of the blank falls within the range of from 1% to 50%.

The fourth photomask blank of the present invention is a phase shift photomask blank formed by successively stacking a dry etching stopper layer and a phase shifter layer in the mentioned order on an optically polished substrate, wherein the dry etching stopper layer comprises either a film composed mainly of tin oxide nitride or an alumina film formed by sputtering, followed by heat treatment carried out in an oxidizing atmosphere.

The phase shift photomask or photomask of the present invention is produced by patterning the phase shifter layer or the light-shielding layer of the above-described photomask blanks to form a phase shifter pattern or a light-shielding pattern.

In the present invention, either a film composed mainly of tin oxide nitride or an alumina film formed by sputtering, followed by heat treatment carried out in an oxidizing atmosphere, is used as a dry etching stopper layer. Therefore, the dry etching stopper layer improves in the permeability to i-rays from a mercury-arc lamp and in the dry etching resistance over the conventional film composed mainly of tin oxide. Accordingly, when the phase shifter layer is etched, the required overetching can satisfactorily be performed, and precise phase control can be effected. In addition, no in-plane transmittance distribution occurs.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

The photomask blank and phase shift photomask of the present invention will be described below more specifically by way of examples.

EXAMPLE 1

Figure 1:
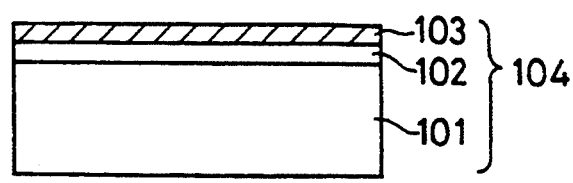
FIG. 1 is a sectional view of a photomask blank according to one embodiment of the present invention.

FIG. 1 is a sectional view of a photomask blank according to one embodiment of the present invention. On an optically polished, ultrahigh-purity synthetic quartz glass substrate 101, a tin oxide nitride layer 102 is formed to a thickness of about 20 nm under the conditions shown in Table 1 below by DC magnetron sputtering method. Subsequently, a light-shielding layer 103 containing chromium as a principal component is formed on the tin oxide nitride layer 102 to a thickness of about 90 nm by DC magnetron sputtering method, thereby obtaining a photomask blank 104.

TABLE 1

| Sputter pressure | 5 mTorr |
| --- | --- |
| Sputter gas | Ar, $N_2$, $O_2$ |
| Gas flow rate | Ar = 50 sccm, $N_2$ = 40 sccm, $O_2$ = 30 sccm |
| Sputter electric power | DC 200 W |
| Target | Sn |

EXAMPLE 2

Figure 2A:
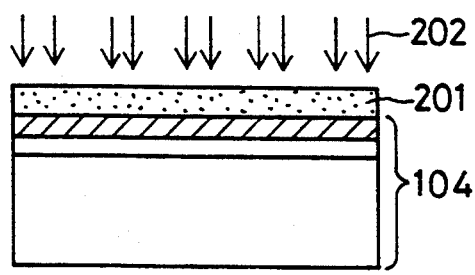
FIGS. 2(a)–2(d) are sectional views showing the sequence of steps for processing the photomask blank, shown in FIG. 1, to a photomask.
Figure 2B:
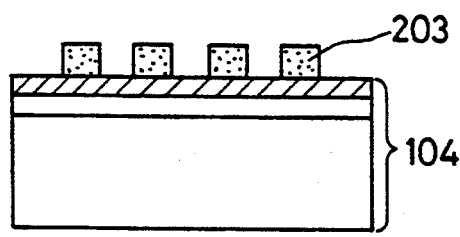
Figure 2C:
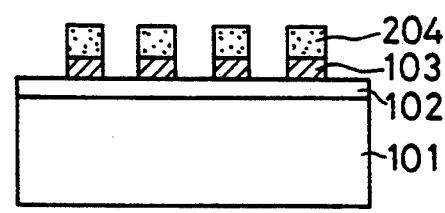
Figure 2D:
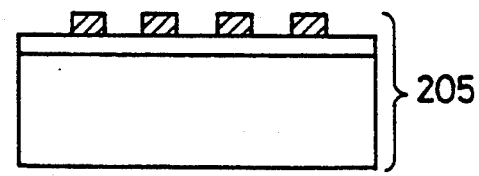

FIGS. 2(a)–2(d) show the sequence of steps for processing the photomask blank 104, obtained in Example 1, to a photomask 205. As shown in FIG. 2(a), a thin electron beam resist film 201 is formed on the photomask blank 104, and the thin resist film 201 is patterned by exposure as shown by reference numeral 202 by using an electron beam exposure system. After postbake, development is carried out to obtain a resist pattern 203, as shown in FIG. 2(b). Thereafter, the light-shielding layer 103 which is exposed through the openings of the resist pattern 203 is etched, as shown in FIG. 2(c), by using an etchant consisting essentially of an aqueous solution of ammonium cerium (II) nitrate. Then, the remaining resist 204 is removed to obtain a photomask 205 as shown in FIG. 2(d).

EXAMPLE 3

Figure 3A:
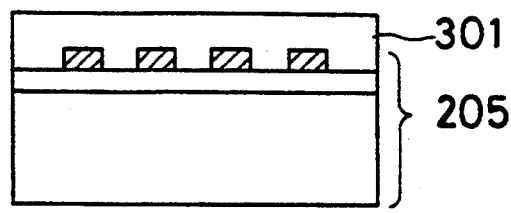
FIGS. 3(a)–3(e) are sectional view showing the sequence of steps for processing the photomask, shown in FIGS. 2(a)–2(d) to an overlying shifter type phase shift photomask.
Figure 3B:
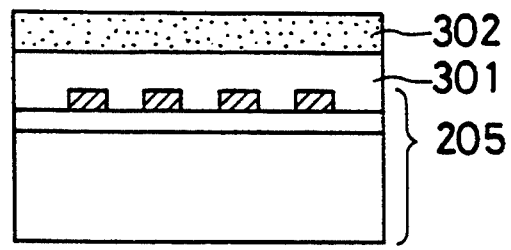
Figure 3C:
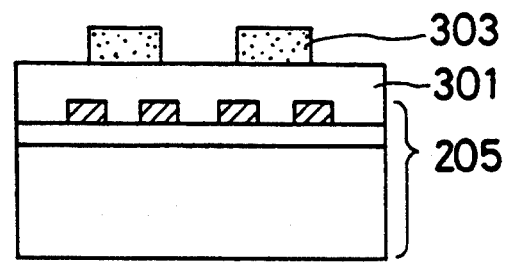
Figure 3D:
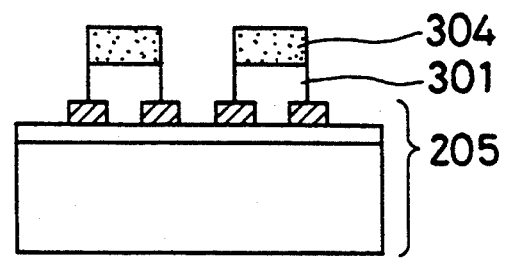
Figure 3E:
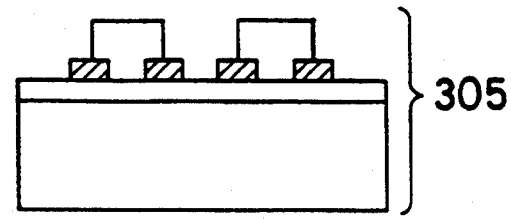

The photomask 205, obtained in Example 2, showed excellent characteristics when processed to an overlying shifter type phase shift photomask by a method as shown in FIG. 3(a)–3(e). That is, as shown in FIG. 3(a), commercially available coating glass (Accuglass 211S, manufactured by Allied Signal) was coated on the photomask 205, obtained in Example 2, and fired so that the film thickness after firing was 400 nm, thereby forming a phase shifter layer 301. Thereafter, as shown in FIG. 3(b), a resist 302 was coated on the phase shifter layer 301 and subjected to patterning, development and so forth to obtain a resist pattern 303 as shown in FIG. 3(c). Next, the phase shifter layer 301 exposed through the openings of the resist pattern 303 was subjected to dry etching (see FIG. 3(d)) under the conditions shown in Table 2 below. In this dry etching process, overetching was carried out for 10 minutes in addition to the etch time estimated from the dry etch rate of the phase shifter layer 301, which had been obtained in advance. Finally, the remaining resist 304 was removed to obtain an overlying shifter type phase shift photomask 305 as shown in FIG. 3(e).

Although the phase shifter layer 301 was subjected to overetching for 10 minutes, neither a large variation in the transmittance nor a large reduction in the film thickness was observed for the etching stopper layer 102. Further, the desired vertical steps were satisfactorily obtained in the phase shifter pattern.

TABLE 2

| Etch gas | $CF_4$ |
| --- | --- |
| Etch pressure | 3.0 pa |
| Etch electric power | 100 W |

Comparative Example 1

A photomask blank and a photomask were produced in the same way as in Examples 1 to 3 except that the etching stopper layer was produced under the conditions shown in Table 3 below.

When the photomask was processed to an overlying shifter type phase shift photomask by a process similar to the above, regions of the phase shifter layer which were overetched showed about 3% rise in the transmittance with respect to i-rays from a mercury-arc lamp in comparison to regions which were not overetched. When the overetch time was shortened to such an extent that the variation in the transmittance becomes so small as to give rise to no problem, it was impossible to obtain a sharp (vertical) cross-sectional configuration for the phase shifter layer.

TABLE 3

| | |
|---|---|
| Sputter pressure | 5 mTorr |
| Sputter gas | Ar, $O_2$ |
| Gas flow rate | Ar = 80 sccm, $O_2$ = 40 sccm |
| Sputter electric power | DC 200 W |
| Target | Sn |

EXAMPLE 4

Figure 4:
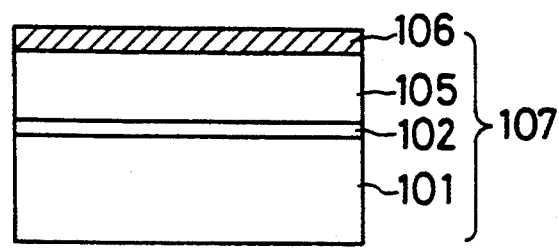
FIG. 4 is a sectional view of a photomask blank according to another embodiment of the present invention.

FIG. 4 is a sectional view of a so-called underlying shifter type phase shift photomask blank according to another embodiment of the present invention. The underlying shifter type phase shift photomask is a phase shift photomask formed by successively stacking a phase shifter layer and a light-shielding layer in the mentioned order on a glass substrate. A photomask blank used to produce such a phase shift photomask is produced as follows. First, a tin oxide nitride layer 102 is formed on an optically polished, ultrahigh-purity synthetic quartz glass substrate 101 to a thickness of about 20 nm by the DC magnetron sputtering method under the conditions shown in Table 1. Subsequently, a phase shifter layer 105 made of commercially available coating glass (SOG) is formed on the tin oxide nitride layer 102 to a thickness of about 400 nm. In addition, a light-shielding layer 106 composed mainly of chromium is formed on the phase shifter layer 105 to a thickness of about 90 nm by the DC magnetron sputtering method, thereby obtaining a phase shift photomask blank 107.

Figure 5A:
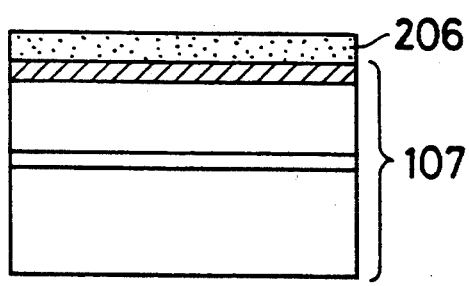
FIGS. 5(a)–5(f) are sectional views showing the sequence steps for processing the photomask blank, shown in FIG. 4, to a phase shift photomask.
Figure 5B:
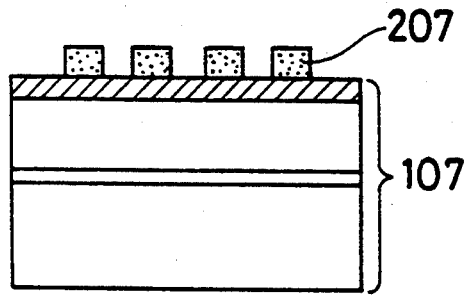
Figure 5C:
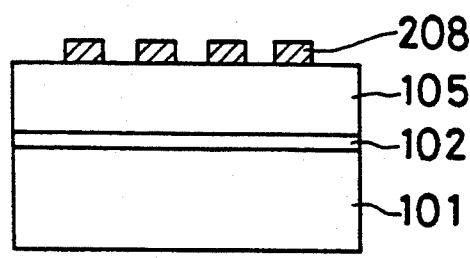
Figure 5D:
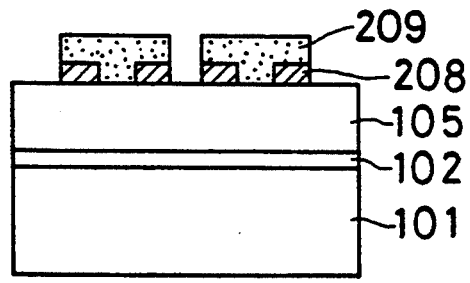
Figure 5E:
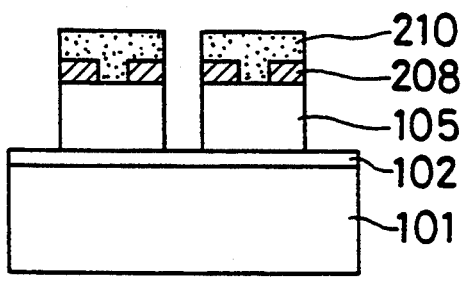
Figure 5F:
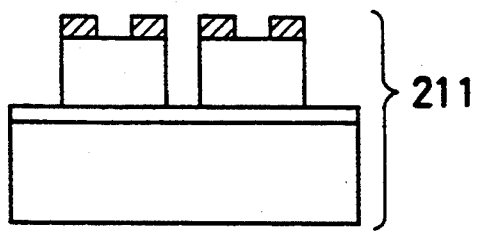

FIGS. 5(a)-2(f) show the sequence of steps for processing the phase shift photomask blank 107, obtained as described above, to an underlying shifter type phase shift photomask. As shown in FIG. 5(a), a thin electron beam resist film 206 is formed on the phase shift photomask blank 107 and patterned by an electron beam exposure system. Thereafter, development is carried out to obtain a resist pattern 207 as shown in FIG. 5(b). Subsequently, the light-shielding layer 106 exposed through the openings of the resist pattern 207 is removed by an etchant. Thereafter, the remaining resist is removed to obtain a light-shielding layer pattern 208 as shown in FIG. 5(c). Next, a resist is coated on the whole surface of the blank again and patterned in a similar manner to the above, thereby forming a resist pattern 209 as shown in FIG. 5(d). Thereafter, the phase shifter layer 105 exposed through the opening of the resist pattern 209 is etched by the dry etching method under the conditions shown in Table 2, as shown in FIG. 5(e). Finally, the remaining resist 210 is removed to obtain a phase shift photomask 211 as shown in FIG. 5(f).

During the above dry etching process, overetching was carried out for 10 minutes in addition to the etch time estimated from the dry etch rate of the phase shifter layer 105, which had been obtained in advance. Although the phase shifter layer 105 was subjected to overetching for 10 minutes, neither a large variation in the transmittance nor a large reduction in the film thickness was observed for the etching stopper layer 102. Further, the desired vertical steps were satisfactorily obtained in the phase shifter pattern.

EXAMPLE 5

Figure 6:
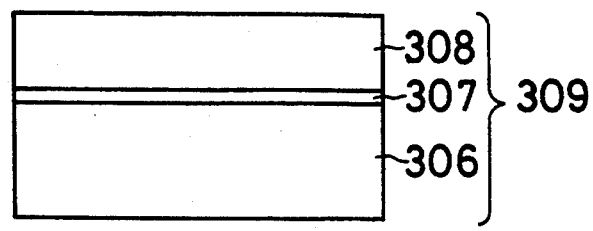
FIG. 6 is a sectional view of a photomask blank according to still another embodiment of the present invention.

FIG. 6 is a sectional view of a blank for a so-called transmissive phase shift photomask. First, a tin oxide nitride layer 307 is formed on an optically polished, ultrahigh-purity synthetic quartz glass substrate 306 to a thickness of about 20 nm by the DC magnetron sputtering method under the conditions shown in Table 1. Subsequently, a phase shifter layer 308 made of commercially available coating glass (SOG) is formed on the tin oxide nitride layer 307 to a thickness of about 400 nm, thereby obtaining a transmissive phase shift photomask blank 309.

Figure 7A:
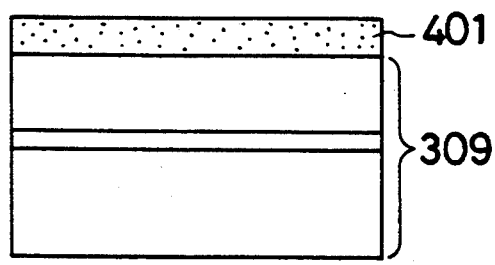
FIGS. 7(a)–7(d) are sectional views showing the sequence of steps for processing the photomask blank, shown in FIG. 6, to a phase shift photomask.
Figure 7C:
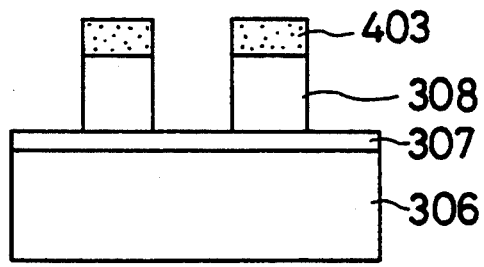
Figure 7B:
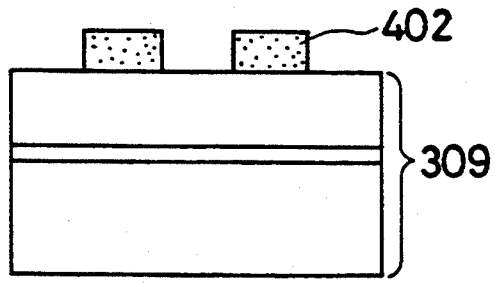
Figure 7D:
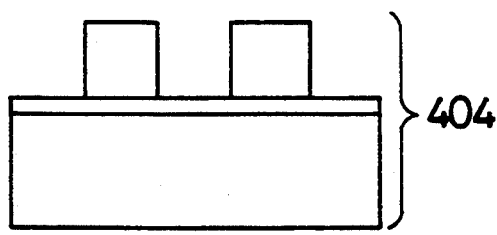

FIGS. 7(a)-7(d) show the sequence of steps for processing the phase shift photomask blank 309 thus obtained to a transmissive phase shift photomask 404. As shown in FIG. 7(a), a thin resist film 401 is formed on the photomask blank 309 and patterned by an electron beam exposure system. Thereafter, development is carried out to obtain a resist pattern 402 as shown in FIG. 7(b). Subsequently, the phase shifter layer 308 exposed through the openings of the resist pattern 402 is etched by the dry etching method under the conditions shown in Table 2, as shown in FIG. 7(c). Finally, the remaining resist 403 is removed to obtain a transmissive phase shift photomask 404 as shown in FIG. 7(d).

During the above dry etching process, overetching was carried out for 10 minutes in addition to the etch time estimated from the dry etch rate of the phase shifter layer 308, which had been obtained in advance. Although the phase shifter layer 308 was subjected to overetching for 10 minutes, neither a large variation in the transmittance nor a large reduction in the film thickness was observed for the etching stopper layer 307. Further, the desired vertical steps were satisfactorily obtained in the phase shifter pattern.

Comparative Example 2

A phase shift photomask blank and a phase shift photomask were produced in the same way as in Examples 4 and 5 except that the etching stopper layer was produced under the conditions shown in Table 3.

During the dry etching process for the phase shifter layer, overetching was carried out for 10 minutes in addition to the etch time estimated from the dry etch rate of the phase shifter layer, which had been obtained in advance. As a result, regions of the phase shifter layer which were overetched showed about 3% rise in the transmittance with respect to i-rays from a mercury-arc lamp in comparison to regions which were not overetched. When the overetch time was shortened to such an extent that the variation in the transmittance becomes so small as to give rise to no problem, it was impossible to obtain a sharp (vertical) cross-sectional configuration for the phase shifter layer.

As has been described above, the etching stopper layer of a phase shift photomask is demanded to have the following functions: when the phase shifter layer is locally dry-etched to form a phase shift pattern, the etching stopper layer underlying the phase shifter layer is difficult to etch; the transmittance with respect to the exposure wavelength (the wavelength of i-rays from an extra-high pressure mercury lamp: 365 nm; the wavelength of krypton fluoride excimer laser: 248 nm; and so forth) in use of the phase shift photomask is high, i.e., at least 85%; and the etching stopper layer has sufficiently high acid resistance to allow an acid washing method (e.g., dipping in concentrated sulfuric acid), which is widely used as one of washing methods during the ordinary photomask producing process, to be also employed in the phase shift photomask producing process.

In many phase shift photomasks for i-rays, films composed mainly of tin oxide are presently used as etching stopper layers, as has been described above. These films are, however, unsatisfactory in terms of dry etching resistance and inferior in permeability in the wavelength region below 350 nm, including the krypton fluoride excimer laser wavelength, that is, 248 nm. Therefore, the films composed mainly of tin oxide are unsuitable for phase shift photomasks used for krypton fluoride excimer laser.

Under these circumstances, a report has been made on a phase shift photomask formed by vacuum evaporation, which has an etching stopper layer comprising an alumina film that exhibits high permeability even in the wavelength region below 350 nm, including the krypton fluoride excimer laser wavelength, i.e., 248 nm, and that has sufficiently high dry etching resistance (see Extended Abstracts of the 52nd Meeting, p.539; The Japan Society of Applied Physics). It has also been reported that this alumina film is readily affected by acids.

Thus, the conventional alumina film suffers from the problem that it is inferior in acid resistance and hence the ordinary acid washing cannot be applied to the phase shift photomask having the alumina film as an etching stopper layer.

In view of the above-described problems, the present inventors conducted exhaustive studies in order to develop an etching stopper layer that has acid resistance and is capable of coping with krypton fluoride excimer laser, and as a result, we have found that an alumina film that is superior in acid resistance and has a transmittance of 85% or more at a wavelength of 200 nm or longer can be obtained by firing alumina ($Al_2O_3$), which has been formed on a transparent substrate, at 600° C. or higher in the atmosphere.

Figure 12:
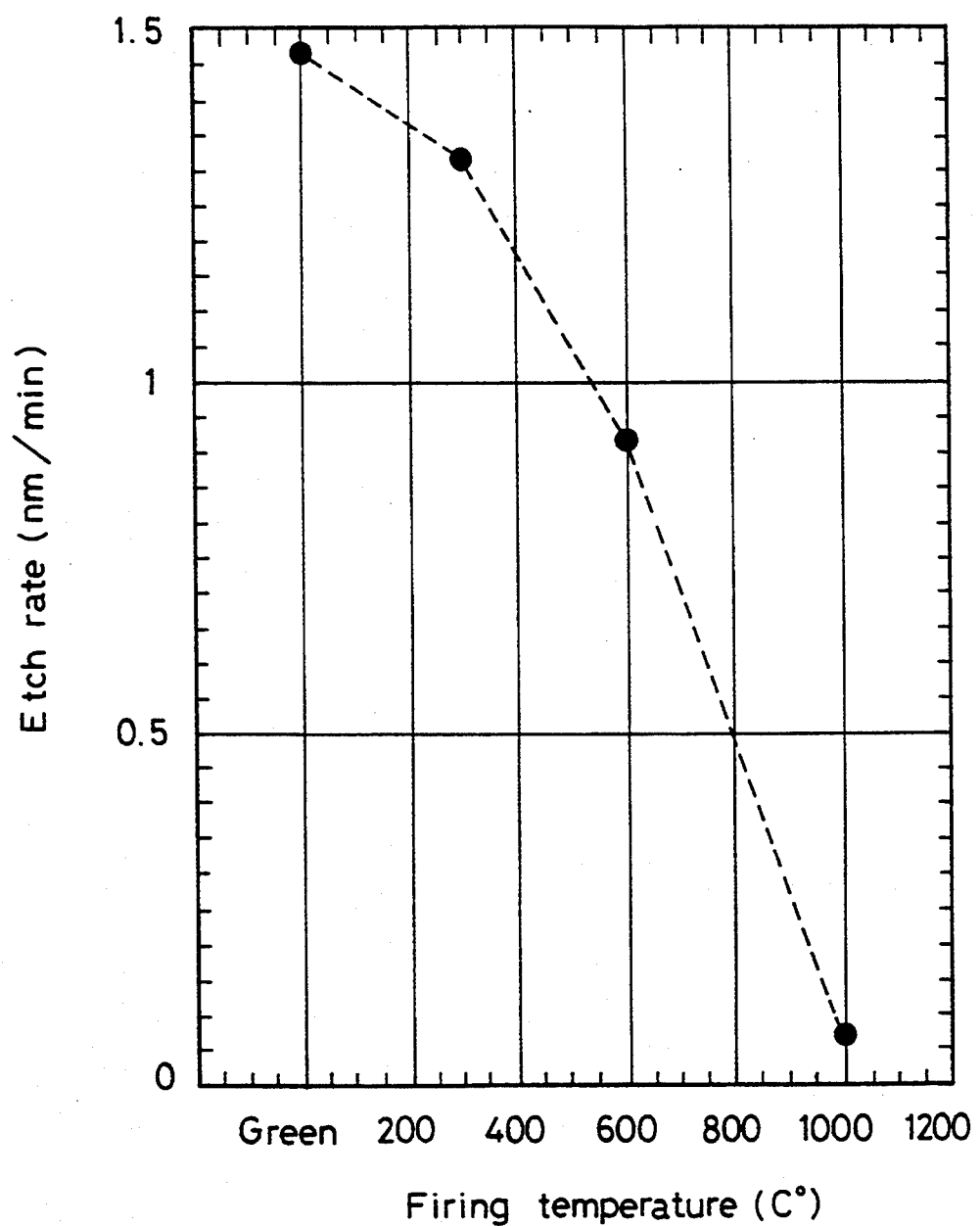
FIG. 12 is a graph showing the variation in etch rate of an alumina film in the present invention with the firing temperature.

FIG. 12 is a graph showing the variation in etch rate (in the etching process by hot sulfuric acid) with the firing temperature of an alumina film when heat-treated for 1 hour in the atmosphere after having been deposited on a quartz substrate to a thickness of 110 nm by sputtering. It will be understood from the graph the acid resistance of the alumina film rises by virtue of the heat treatment carried out in an oxidizing atmosphere. It is particularly preferable to fire the alumina film at 600° C. or higher.

Figure 13:
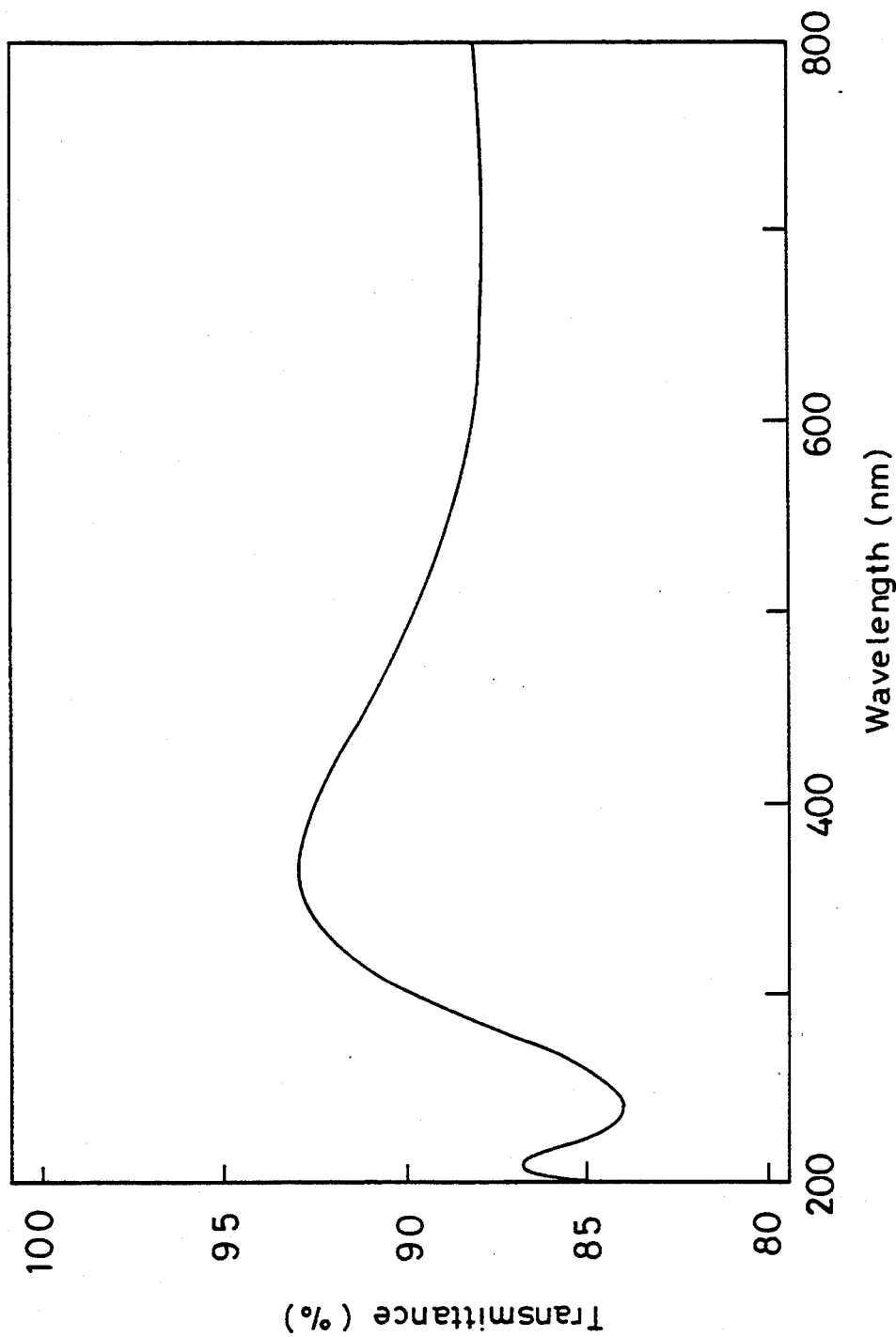
FIG. 13 is a graph showing the spectral transmittance of the alumina film according to the present invention.

FIG. 13 is a graph showing the spectral transmittance in the wavelength range of from 200 nm to 850 nm of the alumina film after the heat treatment at 600° C.

It will be understood from the foregoing description that when heat-treated at 600° C. or higher, the alumina film is improved in acid resistance and exhibits a transmittance of 85% or higher in the wavelength range of from 200 nm to 850 nm.

Incidentally, a phase shifter layer that is stacked on such a heat-treated alumina film may suitably be made of a silicon dioxide film formed by sputtering, CVD, etc., or an SOG (Spin-On-Glass: coating glass) formed by coating and firing.

Preferable examples of the thin light-shielding film layer are single- or multi-layer films composed mainly of chromium, tantalum, molybdenum silicide, etc., or an oxide, nitride, oxide-nitride of any of these substances, formed by sputtering or other similar method.

In this case, the alumina film is preferably formed by carrying out heat treatment at 600° C. or higher.

The following is a description of an embodiment in which an alumina film that is formed by sputtering, followed by heat treatment carried out in an oxidizing atmosphere is employed as an etching stopper layer.

EXAMPLE 6

Figure 8A:
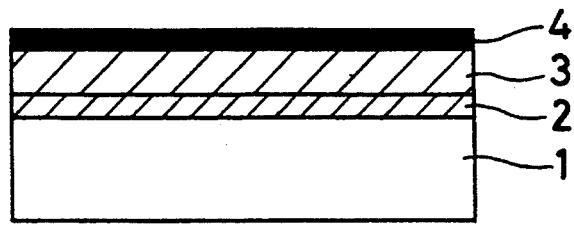
FIGS. 8(a)–8(d) are sectional view of a photomask blank according to a further embodiment of the present invention.
Figure 8B:
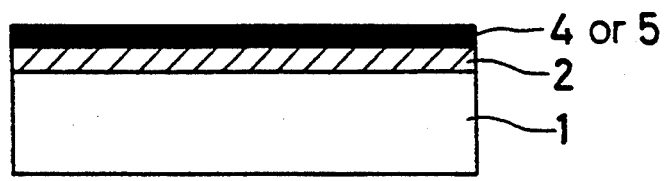
Figure 8C:
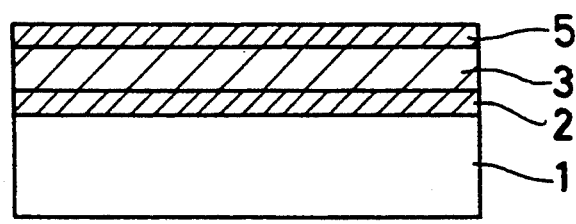
Figure 8D:
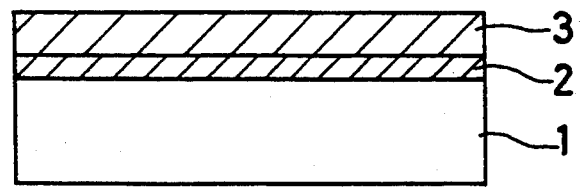

FIGS. 8(a)–8(d) and FIGS. 9(a)–9(d) are sectional views showing a photomask blank and a photomask, which are produced in accordance with this embodiment. FIG. 8(a) shows an underlying shifter type photomask blank, in which a phase shifter layer underlies a light-shielding layer. To produce this blank, alumina is formed on a quartz substrate to a thickness of about 100 nm by the RF magnetron sputtering method and heated at 600° C. or higher in an oxidizing atmosphere by using a kiln or other firing furnace to form an alumina film 2. Next, an SOG (Spin-On-Glass: coating glass), which is to become a phase shifter layer 3, is roll-coated on the alumina film 2 and then fired in an oven or the like to form an SOG film 3 having a thickness of 380 nm to 430 nm. Finally, a chromium film is formed by sputtering to constitute a light-shielding layer 4, thus completing an underlying shifter type phase shift photomask blank as shown in FIG. 8(a). FIGS. 8(b) 8(c) and 8(d) show other examples of the photomask blank. That is, FIG. 8(b) shows an overlying shifter type photomask blank, in which a phase shifter layer overlies a light-shielding layer. FIG. 8(c) shows a halftone phase shift photomask blank. FIG. 8(d) shows a transmissive phase shift photomask blank. In the case of FIG. 8(b), the alumina film 2 is provided on the quartz substrate 1 in the same way as in the case of FIG. 8(a), and either the light-shielding layer 4 or a semitransparent layer 5 is provided on the alumina film 2. In the case of FIG. 8(c), the alumina film 2 is provided on the quartz substrate 1 in the same way as in the case of FIG. 8(a), and the phase shifter layer 3 and the semitransparent layer 5 are successively formed in the mentioned order on the alumina film 2. In the case of FIG. 8(d), the alumina film 2 is provided on the quartz substrate 1 in the same way as in the case of FIG. 8(a), and the phase shifter layer 3 is provided on the alumina film 2.

FIGS. 9(a), 9(b), 9(c) and 9(d) are sectional views showing completed phase shift photomasks, which are produced by using the blanks shown in FIGS. 8(a), 8(b), 8(c) and 8(d), respectively. Since the details of the functions of these photomasks are well known, description thereof is omitted.

Figure 9A:
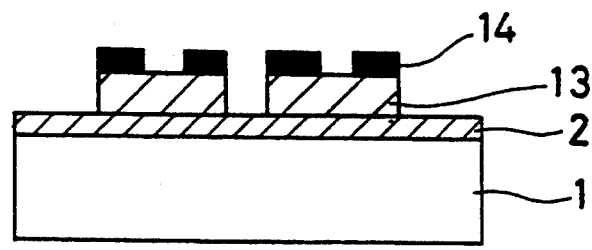
FIGS. 9(a)–9(d) are sectional view showing some phase shift photomasks.
Figure 9B:
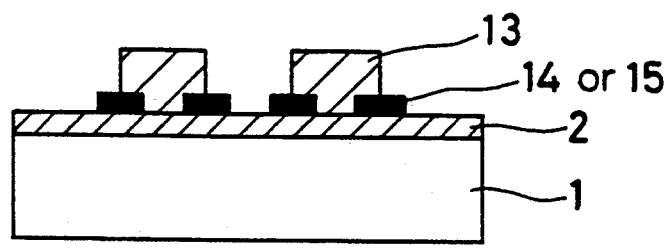

FIGS. 10(a)–10(c) and 11(a–11(d) are sectional views for explanation of the sequence of steps for producing the phase shift photomasks shown in FIGS. 9(a) and 9(b).

Figure 10A:
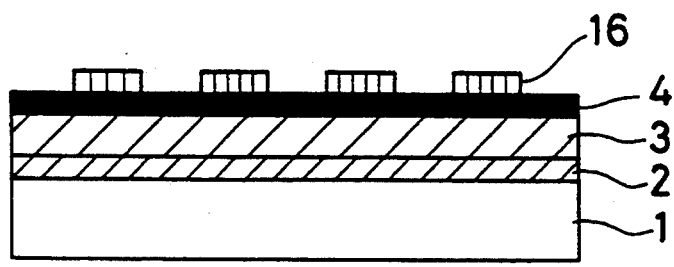
FIGS. 10(a)–10(c) are sectional view showing the sequence of steps for producing the phase shift photomask shown in FIG. 9(a).
Figure 10B:
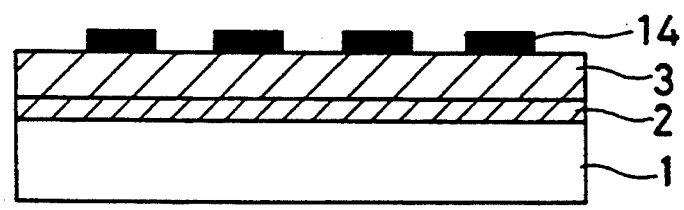
Figure 10C:
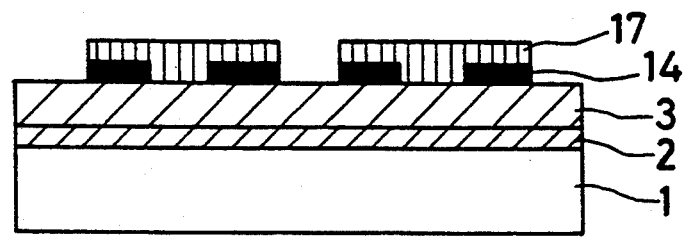

Referring to FIG. 10(a), an ordinary ionizing radiation resist is coated on the blank shown in FIG. 8(a) and exposed to ionizing radiation in a predetermined pattern by an electron beam exposure system. Then, development and rinsing are carried out to form a resist pattern 16. Next, the chromium film 4 exposed through the openings of the resist pattern 16 is etched by a dry or wet etching process to form a chromium pattern 14. Thereafter, the resist pattern 16 is removed (see FIG. 10(b)). Next, an ionizing radiation resist or the like is coated on the chromium pattern 14. After alignment has been made in relation to the chromium pattern 14, the resist is exposed and developed to form a resist pattern 17 (see FIG. 10(c)). Next, the phase shifter layer 3 is etched by a dry or wet etching process, and the resist pattern 17 is removed, thus completing a phase shift photomask having a phase shift pattern 13 as shown in FIG. 9(a).

Figure 11A:
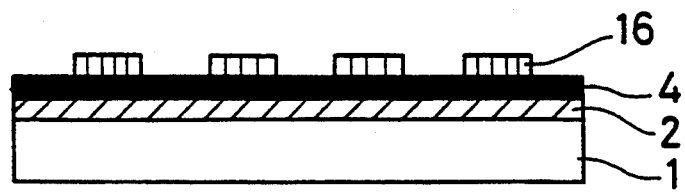
FIGS. 11(a)–11(d) are sectional views showing the sequence of steps for producing the phase shift photomask shown in FIG. 9(b).
Figure 11B:
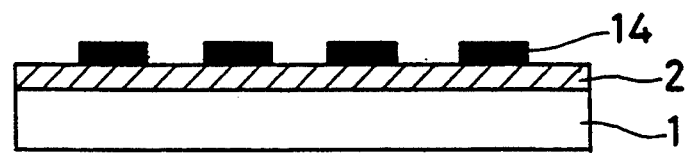
Figure 11C:
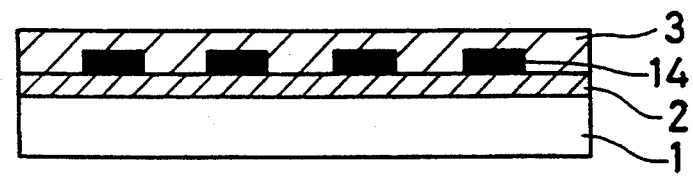
Figure 11D:
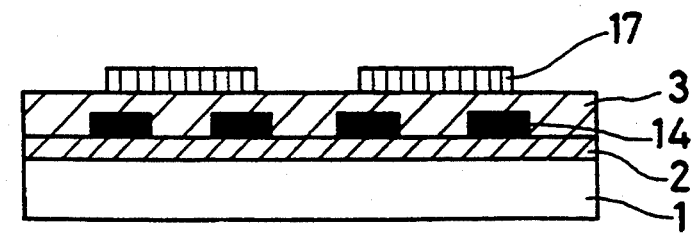

Referring to FIG. 11(a), a resist pattern 16 is formed on the blank shown in FIG. 8(b). Thereafter, the chromium film 4 is selectively etched, and the resist pattern 16 is removed (see FIG. 11(b)). Next, a phase shifter layer 3 is formed, as shown in FIG. 11(c), and further, a resist pattern 17 is formed thereon (see FIG. 11(d)). Thereafter, the phase shifter layer 3 is etched by a dry or wet etching process, and the resist pattern 17 is removed, thus completing an overlying shifter type phase shift photomask having a phase shift pattern 13 as shown in FIG. 9(b).

Figure 9C:
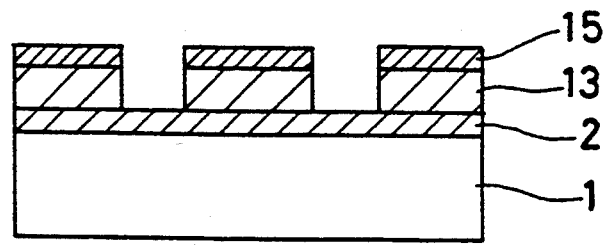
Figure 9D:
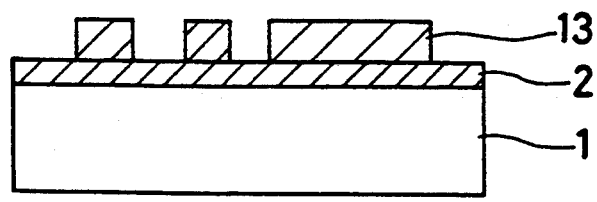

The phase shift photomasks shown in FIGS. 9(c) and 9(d) can also be produced by a method substantially similar to the above.

As will be clear from the foregoing description, the present invention provides a photomask blank and a phase shift photomask, in which a dry etching stopper layer comprises either a film composed mainly of tin oxide nitride or an alumina film formed by sputtering, followed by heat treatment carried out in an oxidizing atmosphere. Therefore, the dry etching stopper layer improves in the permeability to i-rays from a mercury-arc lamp and in the dry etching resistance over the conventional film composed mainly of tin oxide. Accordingly, when the phase shifter layer is etched, the required overetching can satisfactorily be performed, and precise phase control can be effected. In addition, no in-plane transmittance distribution occurs.

In addition, since the tin oxide nitride film can be produced by using a conventional system for producing a photomask blank and a photomask electrically conductive film, no extensive modification is needed for the conventional manufacturing equipment.

If the alumina film, which is formed by sputtering, followed by heat treatment carried out in an oxidizing atmosphere, is used, the etching stopper layer becomes superior in acid resistance and permeability in the range of from the ultraviolet region to the visible region. Accordingly, the ordinary acid washing can be applied to the production of a phase shift photomask, and it is possible to produce a phase shift photomask having minimal defects. Moreover, it is possible to form a phase shift photomask applicable not only to an exposure system that employs i-rays from an extra-high pressure mercury lamp but also to an exposure system that employs a krypton fluoride excimer laser. Accordingly, finer patterns can be formed at high yield in the production of high-density integrated circuits and high-speed devices, e.g., LSIs, VLSIs, etc. Thus, integrated circuits and high-speed devices, which are of higher performance, can be produced at high yield.

What we claim is:

1. A photomask blank formed by successively stacking a dry etching stopper layer and a light-shielding layer in the mentioned order on an optically polished substrate, wherein said dry etching stopper layer comprises a film composed mainly of tin oxide nitride.

2. A photomask blank formed by successively stacking a dry etching stopper layer, a light-shielding layer and a phase shifter layer in the mentioned order on an optically polished substrate, wherein said dry etching stopper layer comprises a film composed mainly of tin oxide nitride.

3. A photomask blank formed by successively stacking a dry etching stopper layer, a phase shifter layer, and a light-shielding layer in the mentioned order on an optically polished substrate, wherein said dry etching stopper layer comprises a film composed mainly of tin oxide nitride.

4. A photomask blank according to claim 2 or 3, wherein when the transmittance of said substrate with respect to a wavelength of exposure light applied during transfer is assumed to be 100%, the overall exposure light transmittance of said blank falls within the range of from 1% to 50%.

5. A photomask blank formed by successively stacking a dry etching stopper layer and a phase shifter layer in the mentioned order on an optically polished substrate, wherein said dry etching stopper layer comprises a film composed mainly of tin oxide nitride.

6. A photomask having a dry etching stopper layer and a light-shielding pattern successively stacked in the mentioned order on an optically polished substrate, wherein said dry etching stopper layer comprises a film composed mainly of tin oxide nitride.

7. A phase shift photomask having a dry etching stopper layer, a light-shielding pattern and a phase shifter pattern successively stacked in the mentioned order on an optically polished substrate, wherein said dry etching stopper layer comprises a film composed mainly of tin oxide nitride.

8. A phase shift photomask having a dry etching stopper layer, a phase shifter pattern and a light-shielding pattern successively stacked in the mentioned order on an optically polished substrate, wherein said dry etching stopper layer comprises a film composed mainly of tin oxide nitride.

9. A phase shift photomask according to claim 7 or 8, wherein when the transmittance at a position where said light-shielding pattern is not present with respect to a wavelength of exposure light applied during transfer is assumed to be 100%, the transmittance at a position where said light-shielding pattern is present falls within the range of from 1% to 50%.

10. A phase shift photomask having a dry etching stopper layer and a phase shifter pattern successively stacked in the mentioned order on an optically polished substrate, wherein said dry etching stopper layer comprises a film composed mainly of tin oxide nitride.

* * * * *